(12) United States Patent
Shibata et al.

(10) Patent No.: US 7,630,845 B2
(45) Date of Patent: Dec. 8, 2009

(54) METHOD FOR CALCULATING TOLERABLE VALUE FOR FLUCTUATION IN POWER SUPPLY VOLTAGE AND METHOD OF TESTING

(75) Inventors: Ryo Shibata, Kasugai (JP); Tomohiko Koto, Kasugai (JP)

(73) Assignee: Fujitsu Microelectronics Limited, Tokyo (JP)

(*) Notice: Subject to any disclaimer, the term of this patent is extended or adjusted under 35 U.S.C. 154(b) by 13 days.

(21) Appl. No.: 11/523,670

(22) Filed: Sep. 20, 2006

(65) Prior Publication Data
US 2007/0225941 A1 Sep. 27, 2007

(30) Foreign Application Priority Data
Mar. 24, 2006 (JP) .............................. 2006-082835

(51) Int. Cl.
G01R 29/26 (2006.01)
H03K 5/22 (2006.01)

(52) U.S. Cl. ................. 702/69; 327/65; 716/6
(58) Field of Classification Search ............ 702/69
See application file for complete search history.

(56) References Cited

U.S. PATENT DOCUMENTS

| | | | | |
|---|---|---|---|---|
| 4,590,433 A | * | 5/1986 | Kusakabe | 327/97 |
| 4,594,677 A | * | 6/1986 | Barlow | 703/15 |
| 5,477,460 A | * | 12/1995 | Vakirtzis et al. | 716/5 |
| 6,041,169 A | * | 3/2000 | Brennan | 716/6 |
| 6,564,355 B1 | * | 5/2003 | Smith et al. | 716/4 |
| 7,139,691 B1 | * | 11/2006 | Duong | 703/19 |
| 2006/0270113 A1 | * | 11/2006 | Dan et al. | 438/118 |

FOREIGN PATENT DOCUMENTS

JP  2005-038400 A  2/2005

OTHER PUBLICATIONS

R. Senthinathan et al.; "Simultaneous Switching Noise of CMOS Devices and Systems"; Kluwer Academic Publishers, 1994; (pp. 23-28).

* cited by examiner

*Primary Examiner*—Jeffrey R West
*Assistant Examiner*—Janet L Suglo
(74) *Attorney, Agent, or Firm*—Fujitsu Patent Center

(57) ABSTRACT

A method for calculating a tolerable value for simultaneous switching noise in an input/output circuit having a differential input supplied with a power supply voltage. The method includes providing an input/output circuit having a differential input unit with a pulse signal of a predetermined duty ratio, setting a tolerable range for the duty ratio of the output signal of the input/output circuit with respect to the pulse signal, changing the power supply voltage supplied to the differential input unit of the input/output circuit, measuring the duty ratio of the output signal corresponding to the voltage change, comparing the measured duty ratio with the tolerable range, and calculating a tolerable value for the simultaneous switching noise.

8 Claims, 6 Drawing Sheets

Fig.1 (a) (Prior Art)
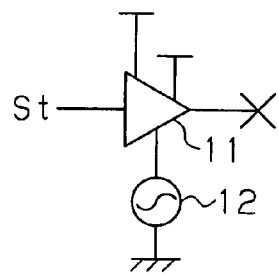
Fig.1 (b) (Prior Art)
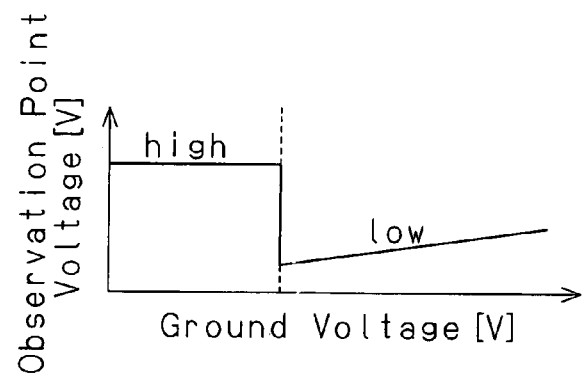
Fig.2 (a) (Prior Art)
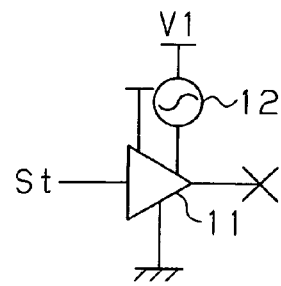
Fig.2 (b) (Prior Art)
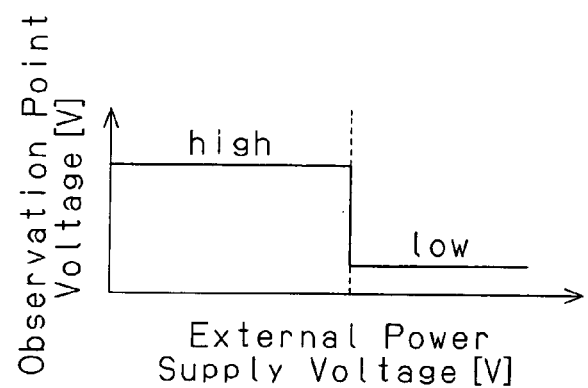

METHOD FOR CALCULATING TOLERABLE VALUE FOR FLUCTUATION IN POWER SUPPLY VOLTAGE AND METHOD OF TESTING

CROSS-REFERENCE TO RELATED APPLICATIONS

This application is based upon and claims the benefit of priority from the prior Japanese Patent Application No. 2006-082835, filed on Mar. 24, 2006, the entire contents of which are incorporated herein by reference.

BACKGROUND OF THE INVENTION

The present invention relates to a method for calculating a tolerable value for fluctuations in power supply voltage and a method of testing. More specifically, the present invention relates to a method for calculating a tolerable value for simultaneous switching noise in an input/output circuit having a differential input, and a method for testing a semiconductor integrated circuit using the calculated tolerable value.

Due to the miniaturization of recent semiconductors, it has become significant that a measure for preventing power supply noise be designed when designing a semiconductor integrated circuit such as a system LSI. The tolerable value for fluctuations in power supply voltage of an input/output circuit must be obtained to estimate the noise.

Semiconductor integrated circuits have become highly integrated due to the miniaturization of semiconductors. This has increased the number of input/output circuits of the semiconductor integrated circuit. Voltage fluctuation occurs in power supply wires when a plurality of input/output circuits are switched at the same time and at the same phase in a semiconductor integrated circuit. The fluctuations in the power supply voltage that occurs in this manner is referred to as simultaneous switching noise (SSN) (see e.g., R. Senthinathan and J. L. Prince, "Simultaneous Switching Noise of CMOS Devices and Systems", Kluwer Academic Publishers, 1994, pp. 23-28). The simultaneous switching noise must be estimated and reduced since power supply voltage fluctuations may lead to erroneous functioning of the semiconductor integrated circuit. Therefore, various methods for estimating simultaneous switching noise (see e.g., Japanese Laid-Open Patent Publication No. 2005-38400) and for reducing simultaneous switching noise have been proposed.

When designing a semiconductor integrated circuit, a designer must determine whether an input/output circuit would actually function erroneously due to simultaneous switching noise. More specifically, the designer performs calculation and computer simulations to obtain the tolerable value for power supply voltage fluctuations in an input circuit and simulate simultaneous switching noise. Then, the designer compares the calculated tolerable value with a noise value to determine whether or not the noise value is tolerable.

In the prior art, voltage values of a high voltage power supply (external power supply) and a low voltage power supply (ground) of the input circuit are changed to determine the voltage value of when the output signal of the input circuit changes as the tolerable value for voltage fluctuations in the external power supply and the ground. For example, referring to FIG. 1(a), a variable power supply 12 is connected between a low voltage power supply terminal of an input circuit 11 and ground. In this case, when an external input terminal of the input circuit 11 is provided with a signal St having an H level and the voltage (ground voltage) supplied to the low voltage power supply terminal changes, an output signal of the input circuit 11 is observed at a predetermined observation point (point marked by x in the drawing). The voltage at the observation point changes from an H level to an L level as the ground voltage increases, as shown in FIG. 1(b). The ground voltage of when the voltage at the observation point changes from an H level to an L level is determined as the tolerable value for ground voltage fluctuations.

In the same manner, referring to FIG. 2(a), the variable power supply 12 is connected between a high voltage power supply terminal of the input circuit 11 and the external power supply. In this case, when an external input terminal of the input circuit 11 is provided with a signal St having an L level, the voltage (external power supply voltage) supplied to the high voltage power supply terminal changes, and the voltage at the output terminal of the input circuit 11 is observed. The voltage at the observation point changes from an L level to an H level as the external power supply voltage decreases, as shown in FIG. 2(b). The external power supply voltage of when the voltage at the observation point changes from an L level to an H level is determined as the tolerable value for voltage fluctuations in the external power supply.

SUMMARY OF THE INVENTION

A buffer circuit including a differential input unit may be used as an input/output circuit. In such a case, when the input/output circuit is provided with a signal having an H level, a signal having an H level is constantly output regardless of ground voltage fluctuations. This is because even if the ground voltage changes, a transistor provided with a signal is inactivated. Since the output signal does not change, the prior art method cannot be used to determine the tolerable value for ground voltage fluctuations. Further, a buffer circuit including a differential input unit actually cannot properly transmit a signal since the buffer circuit outputs a waveform deformed due to ground voltage fluctuations. That is, a buffer circuit including a differential input unit may function erroneously due to simultaneous switching noise.

Furthermore, erroneous operations resulting from power supply voltage fluctuation changes in a manner that is dependent on the operational frequency (input signal frequency) of the semiconductor integrated circuit. However, in the prior art method, the tolerable value is determined in the same manner regardless of the operational frequency. Thus, a tolerable value that is dependent on the operational frequency cannot be obtained.

The present invention provides a method for calculating a tolerable value for simultaneous switching noise in an input/output circuit having a differential input. The present invention also provides a method for testing a semiconductor integrated circuit with a calculated tolerable value for the simultaneous switching noise in an input/output circuit having a differential input.

One aspect of the present invention is a method for calculating a tolerable value for simultaneous switching noise in an input/output circuit having a differential input unit supplied with a power supply voltage. The method includes providing the differential input unit of the input/output circuit with a pulse signal having a predetermined duty ratio to produce an output signal, setting a tolerable range for a duty ratio of the output signal of the input/output circuit with respect to the pulse signal, changing the power supply voltage supplied to the differential input unit of the input/output circuit and measuring the duty ratio of the output signal corresponding to the voltage change, and comparing the measured duty ratio with the tolerable range to calculate the tolerable value for the simultaneous switching noise.

Another aspect of the present invention is a method for calculating a tolerable value for simultaneous switching noise in an input/output circuit having a differential input unit supplied with a power supply voltage. The method includes setting a tolerable range for a gate delay time of the input/output circuit, changing power supply voltage supplied to the differential input unit of the input/output circuit and measuring gate delay time at the differential input unit corresponding to the voltage change, and comparing the measured gate delay time with the tolerable range and calculating the tolerable value for the simultaneous switching noise.

A further aspect of the present invention is a method for testing a semiconductor integrated circuit. The method includes extracting electrical characteristic information of a package including the semiconductor integrated circuit, determining the number and layout of a plurality of input/output circuits for a power supply for the semiconductor integrated circuit based on the electrical characteristic information, extracting a timing at which the plurality of input/output circuits simultaneously are switched in the semiconductor integrated circuit, calculating a noise value for switching noise when the plurality of input/output circuits are simultaneously switched at the extracted timing, measuring at least either one of an output signal duty ratio or a gate delay time for an input/output circuit having a differential input unit when power supply voltage changes, comparing the measured value of at least either one of the output signal duty ratio or the gate delay time of the input/output circuit having the differential input unit with the tolerable range and calculating a tolerable value for the simultaneous switching noise, comparing the calculated tolerable value for the simultaneous switching noise with the calculated noise value of the switching noise, and performing measures for reducing the simultaneous switching noise based on the comparison between the noise value and the tolerable value.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 1(a) and 1(b) are respectively a circuit diagram and a graph illustrating a tolerable value calculation process in the prior art;

FIGS. 2(a) and 2(b) are respectively a circuit diagram and a graph illustrating a tolerable value calculation process in the prior art;

DETAILED DESCRIPTION OF THE PREFERRED EMBODIMENTS

A computer system 100 according to a preferred embodiment of the present invention will now be discussed with reference to FIGS. 3 to 9.

Figure 3:
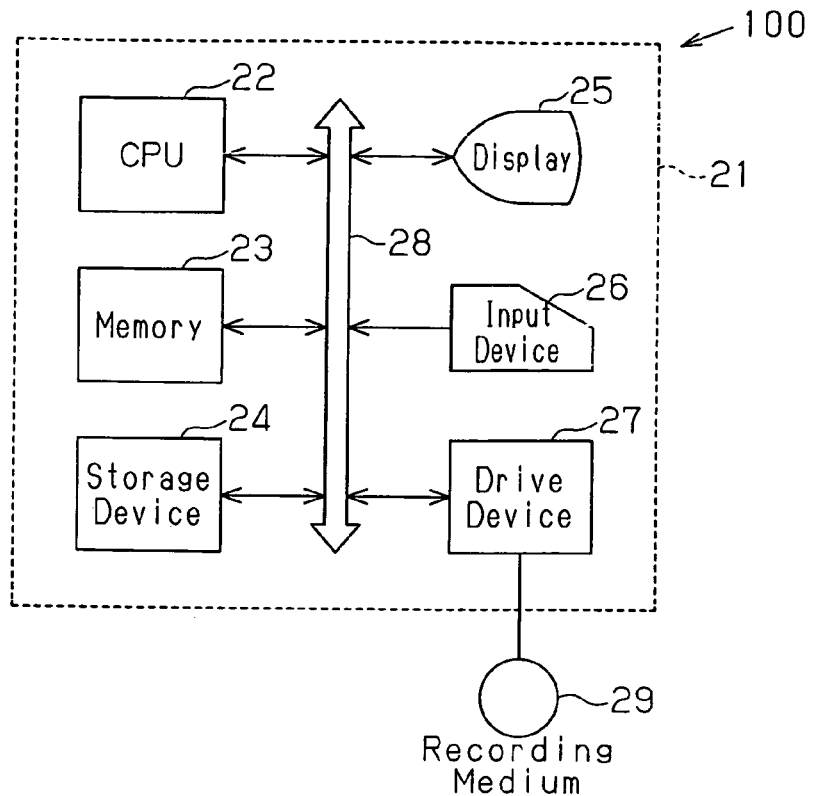
FIG. 3 is a schematic block diagram of a computer system according to a preferred embodiment of the present invention.

FIG. 3 is a schematic block diagram of a computer system 100 for calculating a tolerable value for power supply voltage fluctuations in an input/output circuit. The computer system 100 also conducts tests for simultaneous switching noise.

The computer system 100 includes a computer 21, which may be a typical computer aided design (CAD) apparatus. The computer 21 includes a central processing unit (CPU) 22, a memory 23, a storage device 24, a display device 25, an input device 26, a drive device 27, and a bus 28 for connecting the devices to one another.

The CPU 22 executes programs with the memory 23. More specifically, the CPU 22 executes a tolerable value calculation process for calculating the tolerable value for power supply voltage fluctuations in an input/output circuit having a differential input unit. The CPU 22 also executes a testing process for simultaneous switching noise. Program and data necessary for execution of various processes are stored in the memory 23. The memory 23 is normally a cache memory, a system memory, a display memory, or so on (not shown).

The display device 25 is used to display a layout display page, a parameter input page, and the like. The display device 25 is normally a CRT, LCD, PDP, or the like (not shown). The input device 26 is used by a user to input requests, instructions, and parameters. The input device 26 includes a keyboard, a mouse device, or the like (not shown).

The storage device 24 is normally a magnetic disk device, an optical disc device, a magnetic optical disc, or the like (not shown). The storage device 24 stores various types of information such as data for programs, net lists, and layout data for executing the process for calculating the tolerable value for power supply voltage fluctuations in an input/output circuit having an differential input unit and the process for testing for simultaneous switching noise. The CPU 22 transfers program data to the memory 23 in response to the instruction input to the input device 26 and sequentially executes the transferred programs.

The data for a program executed by the CPU 22 is provided by a recording medium 29. The drive device 27 drives the recording medium 29 to access the contents of the recording medium 29. The CPU 22 reads program data provided from the recording medium 29 by the drive device 27 and installs the read program data in the storage device 24.

The recording medium 29 may be any computer readable recording medium, such as a magnetic tape (MT), a memory card, a flexible disk, an optical disc (CD, DVD, . . . ), a magnetic optical disc (MO, MD, . . . ), or the like (not shown). The program data stored in the recording medium 29 is loaded to the memory 23 when necessary for use.

The recording medium 29 may be a medium or a disc device that records program data uploaded or downloaded through a communication medium. Furthermore, in addition to recording programs directly executed by a computer, the recording medium 29 may record program data installed into another recording medium (hard disc etc.) for execution by a computer. The recording medium 29 may also record program data that is encrypted or compressed.

The process for calculating a tolerable value for power supply voltage fluctuations in the input/output circuit having a differential input unit will now be described.

The computer system 100 conducts a simulation for an input/output circuit having a differential input unit to calculate a tolerable value for power supply voltage fluctuations in the input/output circuit. This is performed by executing a tolerable value calculation process program for calculating the tolerable value for power supply voltage fluctuations. Specifically, the CPU 22 executes the program, provides the differential input unit of the simulated input/output circuit with a pulse signal having a predetermined duty ratio, and determines the tolerable value of the input/output circuit in accordance with whether or not a duty ratio of an output signal of the input/output circuit and a gate delay time of the input/output circuit corresponding to power supply voltage fluctuations are within a tolerable range. The tolerable range is determined in accordance with a target capacity (e.g., timing restriction) of the semiconductor integrated circuit.

Specifically, the waveform of an output signal with respect to an input signal changes in accordance with the power supply voltage fluctuations in the input/output circuit having the differential input unit. Therefore, the tolerable value for power supply voltage fluctuation is determined by measuring the duty ratio of the output signal with the waveform and measuring the delay time (gate delay time) of the output signal with respect to the input signal.

Figure 4:
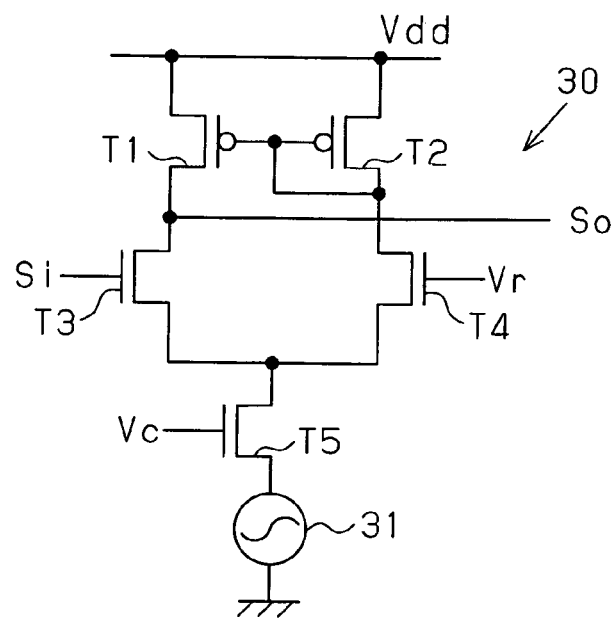
FIG. 4 is a circuit diagram of an input/output circuit having an operation input part.
Figure 5:
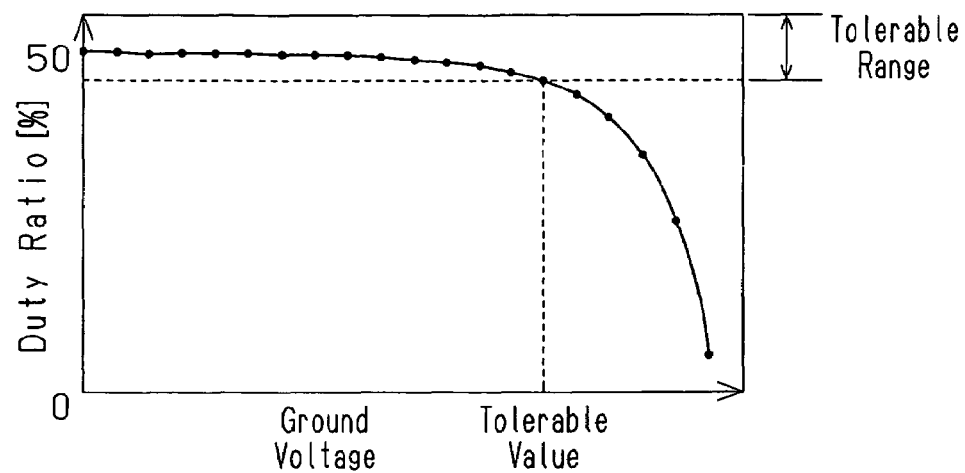
FIG. 5 is a graph illustrating a tolerable value calculation process in the preferred embodiment.
Figure 6:
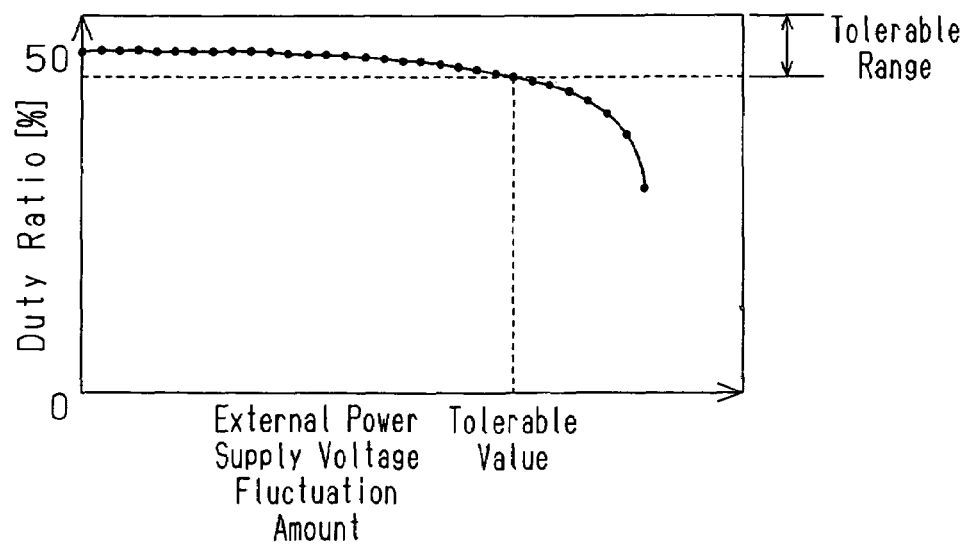
FIG. 6 is a graph illustrating a tolerable value calculation process in the preferred embodiment.

As shown in FIG. 4, the input/output circuit 30 having the differential input unit that is simulated (hereinafter referred to simply as input/output circuit) includes first and second transistors (P-channel MOS transistors) T1 and T2 connected to a high voltage power supply Vdd, which functions as an external power supply. The first and second transistors T1 and T2 are respectively connected to third and fourth transistors (N-channel MOS transistors) T3 and T4, which function as input transistors. Further, the third and fourth transistors T3 and T4 are connected to a fifth transistor (N-channel MOS transistor) T5, which functions as a constant current source. The gate of the first transistor T1 is connected to the gate and drain of the second transistor T2. That is, the first and second transistors T1 and T2 are connected so as to configure a current mirror. An input signal Si is provided to the gate of the third transistor T3, and reference voltage Vr is supplied to the gate of the fourth transistor T4. Control voltage Vc is supplied to the gate of the fifth transistor. An output signal So is output from a node between the first transistor T1 and the third transistor T3. The input/output circuit of the preferred embodiment performs simultaneous switching in a semiconductor integrated circuit. Further, the input/output circuit is used as an input circuit provided with an input signal for the package, an output circuit for outputting a signal from the package, an input/output circuit for propagating a signal in two directions (input direction and output direction), or a buffer circuit for propagating the signal from the internal circuit of the package to another internal circuit.

The input/output circuit 30 of FIG. 4 shows a configuration for determining the tolerable value for ground voltage fluctuations and thus includes a variable power supply 31 connected between the fifth transistor T5 and the ground. The CPU 22 sets the duty ratio of the signal Si provided to the input/output circuit 30 to, for example, 50 percent. The CPU 22 changes the ground voltage, which functions as the power supply voltage, in a DC manner. That is, the CPU 22 changes the source voltage of the fifth transistor T5 by controlling the variable power supply 31. The change in voltage in a DC manner means changing the voltage over a sufficiently long period of time compared to the changing time of the pulse-shaped input signal Si. That is, the ground voltage is substantially constant during a predetermined period in which the input signal Si changes. However, in the entire measuring period, the ground voltage would be observed as if it were changing.

The CPU 22 then measures the duty ratio of the output signal So corresponding to the voltage change. The CPU 22 measures the gate delay time of the input/output circuit 30, that is, the delay time of the output signal So with respect to the input signal Si. At least either one of the duty ratio and the gate delay time is used to determine the tolerable value.

The CPU 22 compares the tolerable range with the measured value of the duty ratio or the gate delay time to determine the tolerable value for ground voltage fluctuations based on the comparison result. For example, referring to FIG. 5, the CPU 22 compares the measured value of the duty ratio with an upper limit value and lower limit value of the tolerable range to determine the ground voltage when the measured value of the duty ratio matches the upper limit value or the lower limit value as the tolerable value.

The variable power supply 31 shown in FIG. 4 is connected between the high voltage power supply Vdd and the first and second transistors T1 and T2 when determining the tolerable value for external power supply voltage fluctuation. In the same manner as when determining the tolerable value for ground voltage fluctuations in a DC manner, the CPU 22 changes the external voltage. That is, the source voltage of the first and second transistors T1 and T2 is changed by controlling the variable power supply 31, and the duty ratio of the output signal So corresponding to the voltage change and the gate delay time of the input/output circuit 30 are measured. The CPU 22 then compares the tolerable range with the measured value of the duty ratio or the gate delay time to determine the tolerable value for external power supply voltage fluctuations based on the comparison result. For example, referring to FIG. 6, the CPU 22 compares the measured value of the duty ratio with the upper limit value and the lower limit value of the tolerable range to determine the external power supply voltage when the measured value of the duty ratio matches the upper limit value or the lower limit value as the tolerable value. The horizontal axis of FIG. 6 indicates the fluctuation amount of the external power supply voltage, that is, the differential voltage between the high voltage power supply Vdd and the source voltage of the first and second transistors T1 and T2. Accordingly, the tolerable value for external power supply voltage fluctuations is obtained by subtracting the fluctuation amount of the external power supply voltage when the measured value of the duty ratio matches the upper limit value or the lower limit value from the external power supply voltage.

Figure 7:
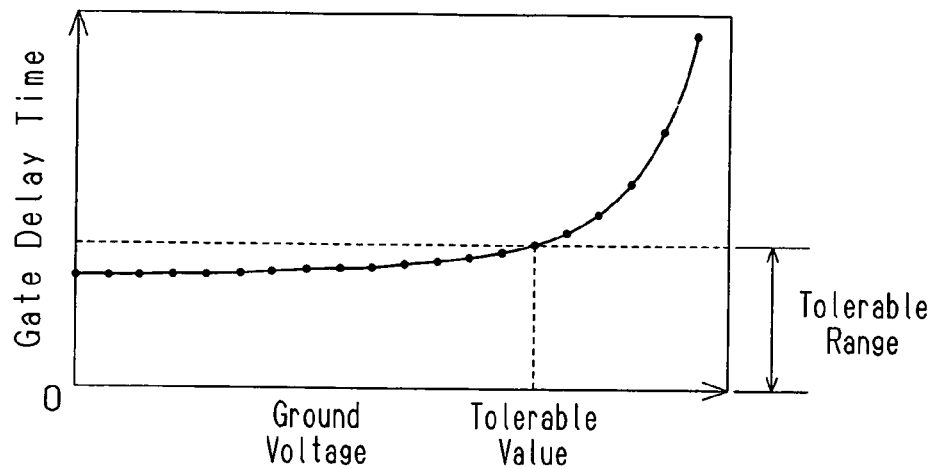
FIG. 7 is a graph illustrating a tolerable value calculation process in the preferred embodiment.
Figure 8:
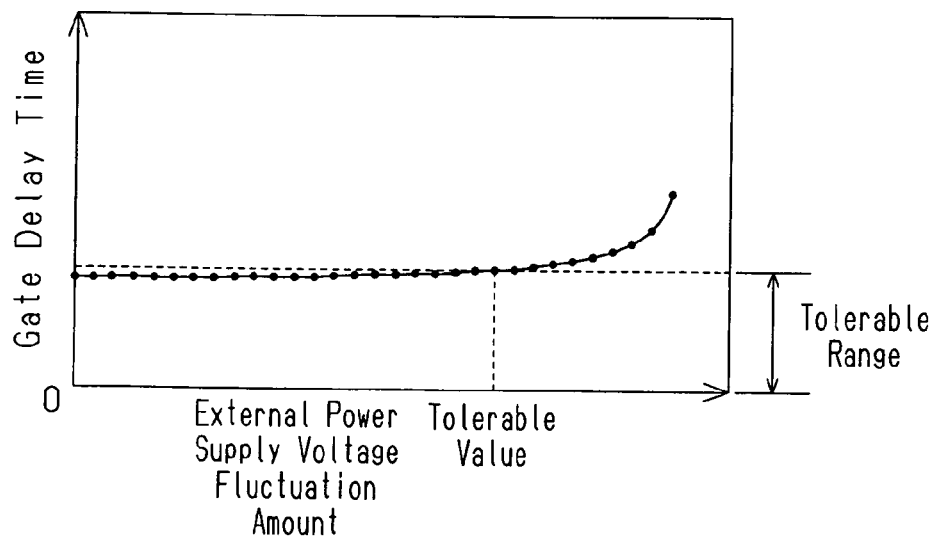
FIG. 8 is a graph illustrating a tolerable value calculation process in the preferred embodiment.

FIG. 7 shows the measurement result of the gate delay time with respect to the change in the ground voltage. In this case, the ground voltage when the delay time exceeds the tolerable range is determined as the tolerable value. FIG. 8 shows the measurement result of the gate delay time with respect to the fluctuation amount of the external power supply voltage. The external power supply voltage obtained from the fluctuation amount when the delay time exceeds the tolerable value is determined as the tolerable value.

The testing process for simultaneous switching noise using the tolerable value determined as described above will now be discussed.

Figure 9:
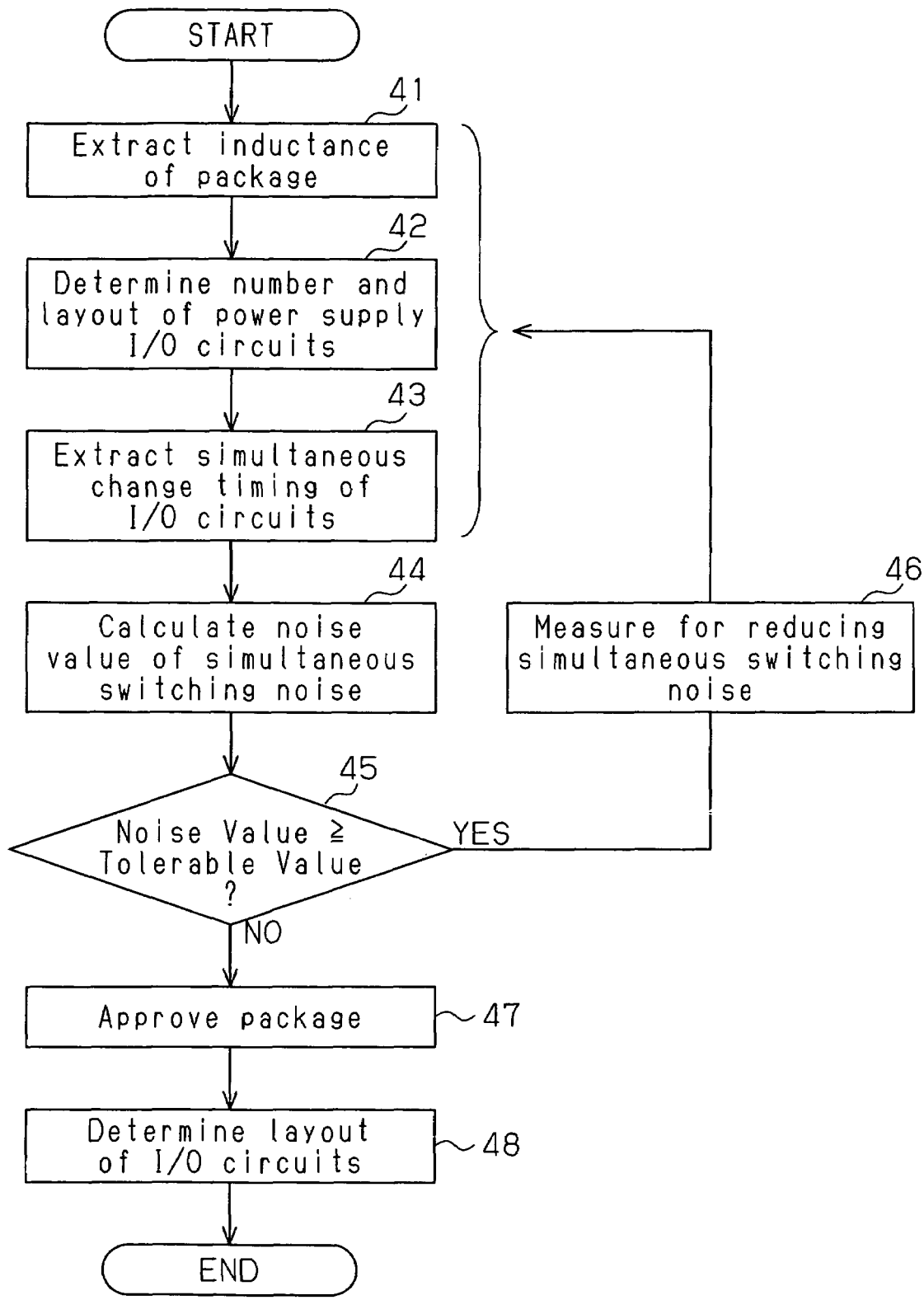
FIG. 9 is a flowchart of a process for testing the simultaneous switching noise in the preferred embodiment.

FIG. 9 shows a flowchart illustrating the testing process for simultaneous switching noise.

First, the CPU 22 extracts inductance of a lead or the like of the package on which the semiconductor integrated circuit is mounted as electrical characteristic information of the package (step 41). The CPU 22 then determines the number and layout of a plurality of input/output (I/O) circuits for a power supply based on the electrical characteristic information (step 42). Then, the CPU 22 extracts the timing when the input/output circuits are simultaneously switched (step 43). The information is stored in the memory 23 or the storage device 24 of FIG. 3.

The CPU 22 then calculates the noise value of the switching noise when the plurality of input/output circuits are simultaneously switched at the extracted timing (step 44), and compares the tolerable value calculated in the above manner and the noise value (step 45). If the noise value is greater than or equal to the tolerable value (YES in step 45), the CPU 22 carries out measures for reducing the simultaneous switching noise (step 46). The measures include reducing the number of simultaneously switched buffers by changing timings and the like, reducing the inductance of the package, increasing the number of power supply pins (external power supply, ground), and changing the type of input/output circuit. At least one of the measures is performed in accordance with the configuration of the semiconductor integrated circuit. The process then proceeds to steps corresponding to the performed measure. For example, when the inductance of the package is changed, the process proceeds to step 41 and extracts a new inductance.

If the noise value is less than the tolerable value in step 45 (NO), the CPU 22 approves the package (step 47), determines the layout of the input/output circuits (step 48), and then ends the testing process.

Through the testing process including the above steps, the layout of the semiconductor integrated circuit is tested with the tolerable value calculated for the simultaneous switching noise in the input/output circuit 30 having the differential input unit.

The computer system 100 of the preferred embodiment has the advantages described below.

(1) The CPU 22 provides the differential input unit of the input/output circuit 30 with the pulse signal Si having a predetermined duty ratio, changes the power supply voltage of the differential input unit, and measures the duty ratio of the output signal So corresponding to the voltage change. The CPU 22 then compares the measured duty ratio and the tolerable range and calculates the tolerable value. As a result, the waveform of the output signal of the differential input unit changes in accordance with the power supply voltage fluctuation. Thus, the CPU 22 measures at least one of either the duty ratio in the output signal So and the gate delay time to calculate the tolerable value for simultaneous switching noise in the input/output circuit having the differential input unit.

(2) The CPU 22 compares the upper limit value and the lower limit value of the tolerable range and the measured value of the duty ratio to determine the power supply voltage when the measured value matches the upper limit value or the lower limit value as the tolerable value. As a result, the CPU 22 determines the tolerable value corresponding to the tolerable range.

(3) The tolerable range is set based on the target capacity of the semiconductor integrated circuit. The tolerable value for the input/output circuit having the differential input unit cannot be calculated with the prior art method. Therefore, in comparison with the prior art method, surplus margin for designing the semiconductor integrated circuit is eliminated since the tolerable value corresponding to the target performance of the semiconductor integrated circuit is calculated. Thus, designing is performed with an appropriate margin.

It should be apparent to those skilled in the art that the present invention may be embodied in many other specific forms without departing from the spirit or scope of the invention. Particularly, it should be understood that the present invention may be embodied in the following forms.

Figure 10A:
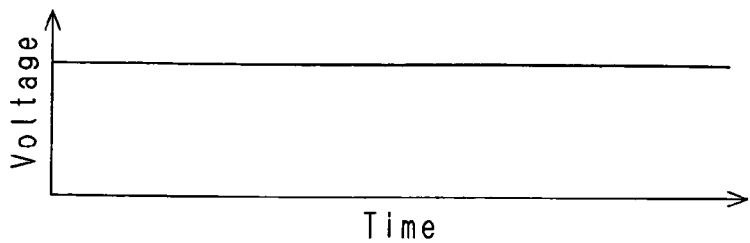
FIGS. 10(a) to 10(c) are waveform charts of the power supply voltage that is changed in a further embodiment of the present invention.
Figure 10B:
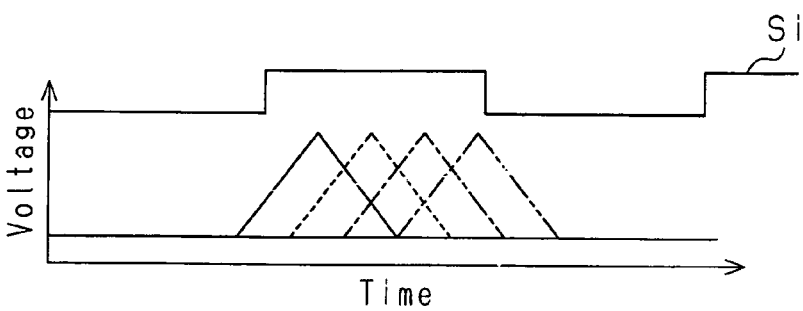
Figure 10C:
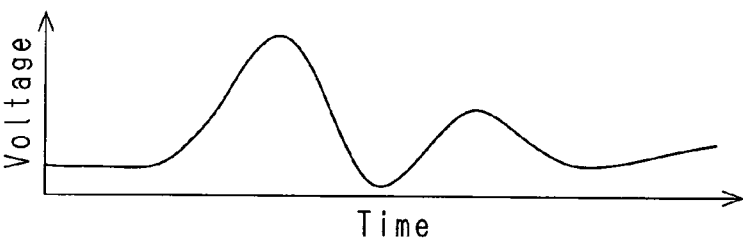

The power supply voltage is a DC waveform in the above embodiment, as shown in FIG. 10($a$). However, other waveforms may be used in further embodiments of the present invention. For example, as shown in FIG. 10($b$), the power supply voltage may be swept according to a triangular wave. In this case, the sweep timing may be changed as time elapses with respect to changes in the input signal Si as shown with by the broken line, the single-dashed line, and the double-dashed line in FIG. 10($b$). This enables checking of whether or not the tolerable value changes as time elapses from when the input signal Si changes. The waveform of the voltage may be a sine wave, a sawtooth wave, or the like instead of a triangular wave.

Furthermore, the waveform of the simultaneous switching noise in the power supply may be stored in the storage device 24 and the like, and the power supply voltage may be changed based on the noise waveform, as shown in FIG. 10($c$).

The configuration of the input/output circuit 30 in the embodiment may be changed as required. For example, the input/output circuit 30 may include a buffer or an inversion buffer for amplifying the signal So. Further, the present invention may be embodied in a level shift circuit or the like that is supplied with different power supply voltages for changing the amplitudes of the input signal and the output signal.

In the preferred embodiment, the pulse-shaped signal Si is provided to the input/output circuit 30, and the delay of the output signal So with respect to the provided pulse-shaped signal Si, or the gate delay time, is used. However, the input signal does not need to be pulse-shaped, and just the time until the output signal So changes from when the input signal Si changed may be measured to determine the tolerable value.

The present examples and embodiments are to be considered as illustrative and not restrictive, and the invention is not to be limited to the details given herein, but may be modified within the scope and equivalence of the appended claims.

What is claimed is:

1. A method for calculating a tolerable value for simultaneous switching noise in an input/output circuit having a differential input unit supplied with a power supply voltage, the method comprising:
   providing the differential input unit of the input/output circuit with a pulse signal having a predetermined duty ratio to produce an output signal;
   setting a tolerable range for a duty ratio of the output signal of the input/output circuit with respect to the pulse signal;
   changing the power supply voltage supplied to the differential input unit of the input/output circuit and measuring the duty ratio of the output signal corresponding to the power supply voltage being changed; and
   comparing the measured duty ratio with the tolerable range to calculate the tolerable value for the simultaneous switching noise.

2. The method according to claim 1, wherein said comparing the measured duty ratio with the tolerable range includes comparing the measured duty ratio with an upper limit value and a lower limit value of the tolerable range and determining the power supply voltage when the measured duty value matches the upper limit value or the lower limit value as the tolerable value for the simultaneous switching noise.

3. The method according to claim 1, wherein said setting a tolerable range for a duty ratio of the output signal of the input/output circuit includes setting the tolerable range in accordance with a target capacity of a semiconductor integrated circuit including the input/output circuit.

4. A method for calculating a tolerable value for simultaneous switching noise in an input/output circuit having a differential input unit supplied with a power supply voltage, the method comprising:
   setting a tolerable range for a gate delay time of the input/output circuit;
   changing power supply voltage supplied to the differential input unit of the input/output circuit and measuring gate delay time at the differential input unit corresponding to the power supply voltage being changed; and
   comparing the measured gate delay time with the tolerable range and calculating the tolerable value for the simultaneous switching noise.

5. The method according to claim 4, wherein said comparing the measured gate delay time with the tolerable range includes comparing the measured gate delay time with an upper limit value and a lower limit value of the tolerable range and determining power supply voltage when the measured gate delay time matches the upper limit value or the lower limit value as the tolerable value for the simultaneous switching noise.

6. The method according to claim 4, wherein said setting the tolerable range of the gate delay time of the input/output circuit includes setting the tolerable range in accordance with a target capacity of a semiconductor integrated circuit including the input/output circuit.

7. A method for testing a semiconductor integrated circuit, the method comprising:
   extracting electrical characteristic information of a package including the semiconductor integrated circuit;
   determining the number and layout of a plurality of input/output circuits for a power supply for the semiconductor integrated circuit based on the electrical characteristic information;
   extracting a timing at which the plurality of input/output circuits simultaneously are switched in the semiconductor integrated circuit;
   calculating a noise value for switching noise when the plurality of input/output circuits are simultaneously switched at the extracted timing;
   measuring at least either one of an output signal duty ratio or a gate delay time for an input/output circuit having a differential input unit when a power supply voltage supplied to the input/output circuit changes;
   comparing the measured value of at least either one of the output signal duty ratio or the gate delay time of the input/output circuit having the differential input unit with a tolerable range and calculating a tolerable value for the simultaneous switching noise;
   comparing the calculated tolerable value for the simultaneous switching noise with the calculated noise value of the switching noise; and
   performing measures for reducing the simultaneous switching noise based on the comparison between the noise value and the tolerable value.

8. A method for testing a semiconductor integrated circuit, the method comprising:
   extracting electrical characteristic information of a package including the semiconductor integrated circuit;
   determining the number and layout of a plurality of input/output circuits for a power supply for the semiconductor integrated circuit based on the electrical characteristic information;
   extracting a timing at which the plurality of input/output circuits simultaneously are switched in the semiconductor integrated circuit;
   calculating a noise value for switching noise when the plurality of input/output circuits are simultaneously switched at the extracted timing;
   measuring a gate delay time for an input/output circuit having a differential input unit when a power supply voltage supplied to the input/output circuit changes;
   comparing the measured value of the gate delay time of the input/output circuit having the differential input unit with a tolerable range for the gate delay time and calculating a tolerable value for the simultaneous switching noise;
   comparing the calculated tolerable value for the simultaneous switching noise with the calculated noise value of the switching noise; and
   performing measures for reducing the simultaneous switching noise based on the comparison between the noise value and the tolerable value.

* * * * *